(12) United States Patent
Yagami et al.

(10) Patent No.: US 10,862,448 B2
(45) Date of Patent: Dec. 8, 2020

(54) PIEZOELECTRIC THIN FILM RESONATOR, FILTER, AND MULTIPLEXER

(71) Applicant: TAIYO YUDEN CO., LTD., Tokyo (JP)

(72) Inventors: Yoshiyuki Yagami, Tokyo (JP); Ryuichi Okamura, Tokyo (JP); Yoshiaki Takaoka, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 460 days.

(21) Appl. No.: 15/667,339

(22) Filed: Aug. 2, 2017

(65) Prior Publication Data
US 2018/0062609 A1 Mar. 1, 2018

(30) Foreign Application Priority Data
Aug. 31, 2016 (JP) .................. 2016-170315

(51) Int. Cl.
*H03H 9/02* (2006.01)
*H03H 9/13* (2006.01)
*H03H 9/17* (2006.01)

(52) U.S. Cl.
CPC .... *H03H 9/02118* (2013.01); *H03H 9/02015* (2013.01); *H03H 9/02149* (2013.01); *H03H 9/132* (2013.01); *H03H 9/173* (2013.01); *H03H 9/175* (2013.01)

(58) Field of Classification Search
CPC .......... H03H 9/02118; H03H 9/02015; H03H 9/02149; H03H 9/132; H03H 9/173; H03H 9/175
USPC .................................. 310/322, 324
See application file for complete search history.

(56) References Cited

U.S. PATENT DOCUMENTS

| | | | |
|---|---|---|---|
| 2006/0091764 A1 | 5/2006 | Tsutsumi et al. | |
| 2010/0148636 A1* | 6/2010 | Nishihara | H03H 9/02015 310/365 |

FOREIGN PATENT DOCUMENTS

JP       2006-128993 A       5/2006

* cited by examiner

*Primary Examiner* — Derek J Rosenau
(74) *Attorney, Agent, or Firm* — Chen Yoshimura LLP (57) ABSTRACT

A piezoelectric thin film resonator includes: a substrate; a piezoelectric film located on the substrate; a lower electrode and an upper electrode facing each other across at least a part of the piezoelectric film; and a wiring layer located on the upper electrode, the wiring layer having a thickness equal to or greater than 0.8 μm and equal to or less than 3.0 μm, at least a part of the wiring layer overlapping in plan view with a resonance region in which the lower electrode and the upper electrode face each other across the piezoelectric film, a distance between an outline of the resonance region and an edge of a lower surface located within the resonance region and farthest from the outline being greater than 0 μm and less than 2 μm.

6 Claims, 10 Drawing Sheets

PIEZOELECTRIC THIN FILM RESONATOR, FILTER, AND MULTIPLEXER

CROSS-REFERENCE TO RELATED APPLICATION

This application is based upon and claims the benefit of priority of the prior Japanese Patent Application No. 2016-170315, filed on Aug. 31, 2016, the entire contents of which are incorporated herein by reference.

FIELD

A certain aspect of the present invention relates to a piezoelectric thin film resonator, a filter, and a multiplexer.

BACKGROUND

Acoustic wave devices using piezoelectric thin film resonators have been used as filters and duplexers of wireless devices such as, for example, mobile phones. The piezoelectric thin film resonator has a structure designed to have a lower electrode and an upper electrode facing each other across a piezoelectric film. The region where the lower electrode and the upper electrode face each other across the piezoelectric film is a resonance region. It has been known that a Q-value is improved by providing an additional film on the extraction region of the upper electrode as disclosed in, for example, Japanese Patent Application Publication No. 2006-128993 (hereinafter, referred to as Patent Document 1).

In Patent Document 1, the acoustic wave leaking from the resonance region in the lateral direction is reduced by providing the additional film such as a wiring layer, and the Q-value is therefore improved. However, a preferable shape of the wiring layer is not studied.

SUMMARY OF THE INVENTION

According to a first aspect of the present invention, there is provided a piezoelectric thin film resonator including: a substrate; a piezoelectric film located on the substrate; a lower electrode and an upper electrode facing each other across at least a part of the piezoelectric film; and a wiring layer located on the upper electrode, the wiring layer having a thickness equal to or greater than 0.8 μm and equal to or less than 3.0 μm, at least a part of the wiring layer overlapping in plan view with a resonance region in which the lower electrode and the upper electrode face each other across the piezoelectric film, a distance between an outline of the resonance region and an edge of a lower surface of the wiring layer located within the resonance region and farthest from the outline being greater than 0 μm and less than 2 μm.

According to a second aspect of the present invention, there is provided a filter including the above piezoelectric thin film resonator.

According to a third aspect of the present invention, there is provided a multiplexer including the above filter.

DETAILED DESCRIPTION

Hereinafter, embodiments of the present invention will be described with reference to the accompanying drawings.

First Embodiment

Figure 1A:
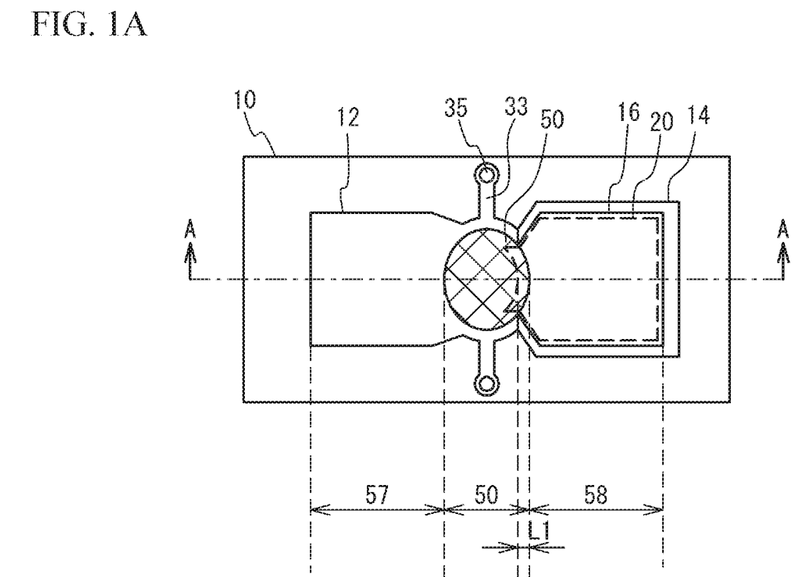
FIG. 1A is a plan view of a piezoelectric thin film resonator in accordance with a first embodiment.
Figure 1B:
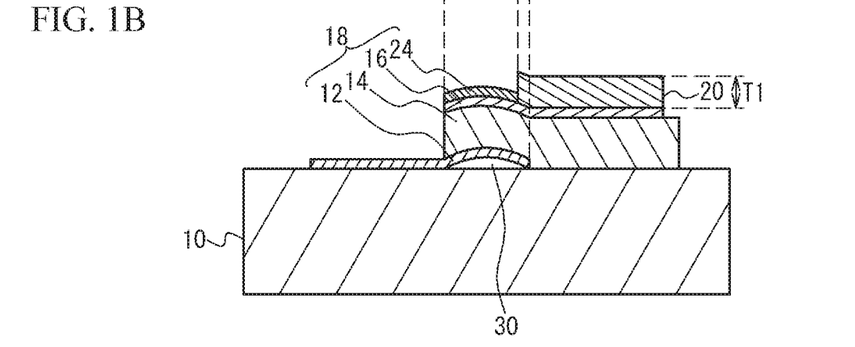
FIG. 1B is a cross-sectional view taken along line A-A in FIG. 1A.

FIG. 1A is a plan view of a piezoelectric thin film resonator in accordance with a first embodiment, and FIG. 1B is a cross-sectional view taken along line A-A in FIG. 1A. As illustrated in FIG. 1A and FIG. 1B, a lower electrode 12 is located on a substrate 10. An air gap 30 having a dome-shaped bulge is formed between the flat principal surface of the substrate 10 and the lower electrode 12. The dome-shaped bulge is a bulge with a shape in which the height of the air gap 30 is low near the periphery of the air gap 30 and increases at closer distances to the center of the air gap 30, for example.

Located on the lower electrode 12 is a piezoelectric film 14 mainly composed of aluminum nitride (AlN) having the (002) direction as the main axis. A resonance region 50 is the region with an elliptical shape in which the acoustic wave in the thickness extension mode resonates. The resonance region 50 is approximately the same as or smaller than the air gap 30 in size, and overlaps with the air gap 30 in plan view.

The lower electrode 12 is extracted from the resonance region 50 to an extraction region 57. An upper electrode 16 is extracted from the resonance region 50 to an extraction region 58. In the extraction region 58, a wiring layer 20 is formed on the upper electrode 16. The wiring layer 20 electrically connects between the piezoelectric thin film resonators and/or electrically connects the piezoelectric thin film resonator to a pad. Since the wiring layer 20 has a lower resistance than the upper electrode 16, the wiring layer 20 located to the resonance region 50 reduces the loss or the like. The wiring layer 20 has a thickness of T1. In plan view, the wiring layer 20 overlaps with a part of the resonance region 50, and the distance along which the wiring layer 20 and the resonance region 50 overlap is defined as an overlap length L1. A protective film 24 is located on the upper electrode 16 in the resonance region 50. A multilayered film 18 in which the acoustic wave resonates in the resonance region 50 includes the lower electrode 12, the piezoelectric film 14, the upper electrode 16, and the protective film 24.

As illustrated in FIG. 1A, an introduction path 33 for etching a sacrifice layer is formed in the lower electrode 12.

The sacrifice layer is a layer for forming the air gap 30. The vicinity of the end of the introduction path 33 is not covered with the piezoelectric film 14, and the lower electrode 12 has a hole portion 35 at the end of the introduction path 33.

The substrate 10 is, for example, a silicon (Si) substrate. The lower electrode 12 is formed of, for example, a chrome (Cr) film and a ruthenium (Ru) film stacked in this order from the substrate 10 side. The piezoelectric film 14 is, for example, an aluminum nitride (AlN) film having the (002) direction as the main axis. The upper electrode 16 is formed of, for example, a Ru film and a Cr film stacked in this order from the piezoelectric film 14 side. The protective film 24 is, for example, a silicon oxide film. The wiring layer 20 is a gold (Au) layer. The material and the film thickness of each layer can be appropriately selected to achieve desired resonance characteristics.

The substrate 10 may be a quartz substrate, a glass substrate, a ceramic substrate, or a GaAs substrate instead of the silicon substrate. The lower electrode 12 and the upper electrode 16 may be formed of a single-layer film of aluminum (Al), titanium (Ti), copper (Cu), molybdenum (Mo), tungsten (W), tantalum (Ta), platinum (Pt), rhodium (Rh), or iridium (Ir), or a multilayered film of at least two of them instead of Ru and Cr. The protective film 24 may be a silicon nitride film or an aluminum nitride film instead of the silicon oxide film.

The piezoelectric film 14 may be made of zinc oxide (ZnO), lead zirconate titanate (PZT), or lead titanate (Pb-TiO$_3$) instead of aluminum nitride. Alternatively, for example, the piezoelectric film 14 may be mainly composed of aluminum nitride and contain another element for improving the resonance characteristics or the piezoelectricity. For example, the use of scandium (Sc), a Group II element and a Group IV element, or a Group II element and a Group V element as an additive element improves the piezoelectricity of the piezoelectric film 14. Thus, the effective electromechanical coupling coefficient of the piezoelectric thin film resonator is improved. The Group II element is, for example, calcium (Ca), magnesium (Mg), strontium (Sr), or zinc (Zn). The Group IV element is, for example, Ti, zirconium (Zr), or hafnium (Hf). The Group V element is, for example, Ta, niobium (Nb), or vanadium (V).

The wiring layer 20 may be a low-resistivity layer such as a Cu layer instead of the Au layer. An adhesion layer such as a Ti layer may be located between the low-resistivity layer and the upper electrode 16. The low-resistivity layer has a lower resistance than the adhesion layer.

Figure 2:
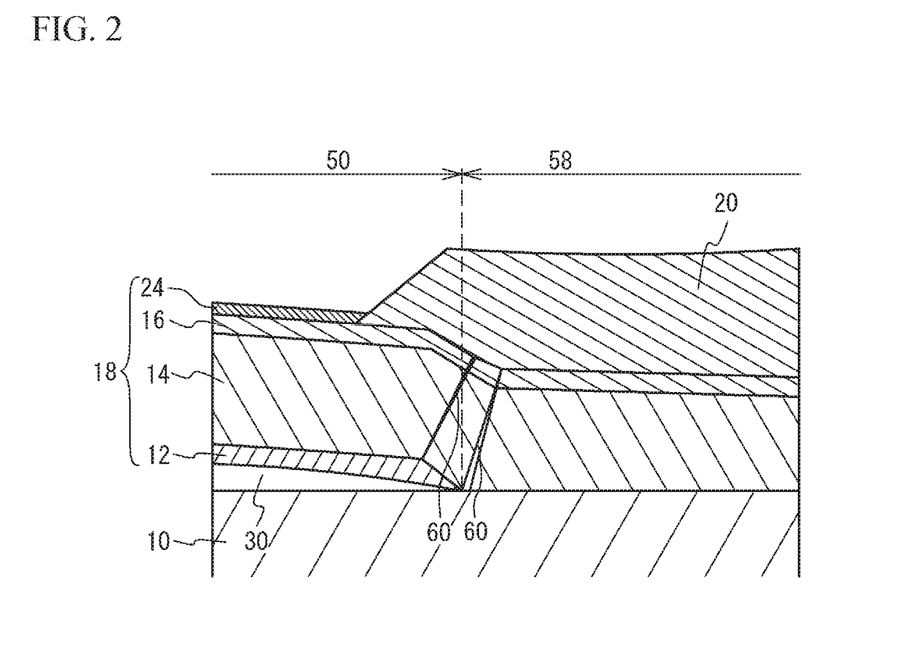
FIG. 2 is an enlarged cross-sectional view in the first embodiment.

The effect obtained when the wiring layer 20 overlaps with the resonance region 50 will be described. FIG. 2 is an enlarged cross-sectional view in the first embodiment. As illustrated in FIG. 2, the piezoelectric film 14 is formed so as to cover the end face of the lower electrode 12 at the side closer to the extraction region 58 of the upper electrode 16 of the resonance region 50. Thus, cracks 60 may be formed in the piezoelectric film 14 on the end face of the lower electrode 12. The formation of the crack may peel the multilayered film 18 in the resonance region 50. If the crack 60 is formed in the upper electrode 16, the electrical connection of the upper electrode 16 may be cut.

In the first embodiment, the wiring layer 20 extends from the extraction region 58 to the resonance region 50. Thus, since the wiring layer 20 holds the multilayered film 18, the peeling of the multilayered film 18 in the resonance region 50 is inhibited. Even when the upper electrode 16 cracks, the electrical connection of the upper electrode 16 is maintained through the wiring layer 20. As described above, the wiring layer 20 preferably overlaps with a part of the resonance region 50.

Figure 3:
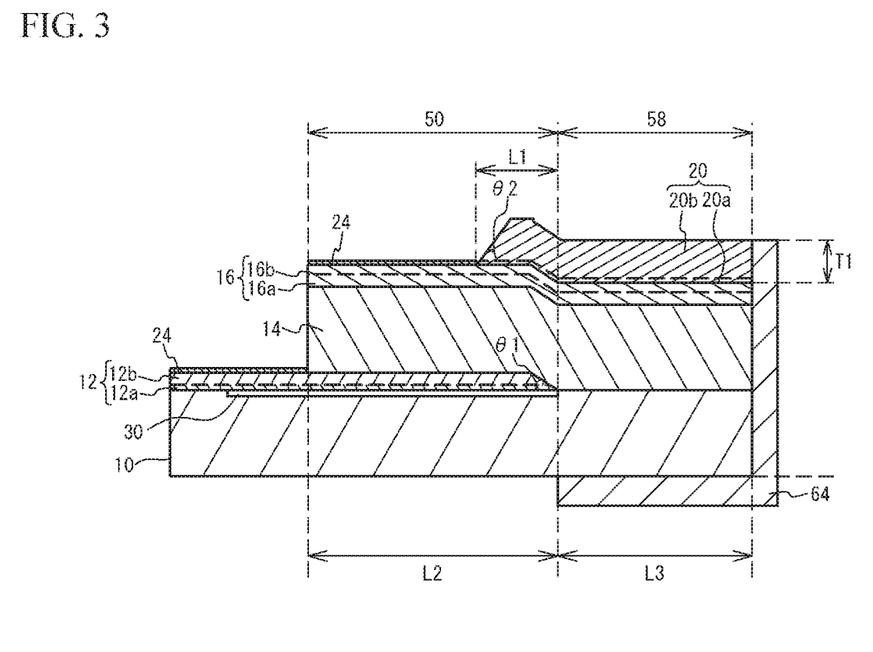
FIG. 3 is a cross-sectional view illustrating the structure simulated in the first embodiment.

The shape of the wiring layer 20 was changed, and the characteristics of the piezoelectric thin film resonator were simulated. The simulation employed a two-dimensional finite element method. FIG. 3 is a cross-sectional view illustrating the structure simulated in the first embodiment. As illustrated in FIG. 3, the air gap 30 is formed in the substrate 10. Located as the lower electrode 12 are a lower layer 12a and an upper layer 12b. Located as the upper electrode 16 are a lower layer 16a and an upper layer 16b. Located as the wiring layer 20 are an adhesion layer 20a and a low-resistivity layer 20b.

The end face of the lower electrode 12 is inclined at an angle θ1 to the upper surface of the substrate 10. This structure lessens cracks formed in the piezoelectric film 14. The end face of the low-resistivity layer 20b is inclined at an angle θ2 to the upper surface of the substrate 10. The thickness of the low-resistivity layer 20b is represented by T1, and the distance along which the resonance region 50 and the wiring layer 20 overlap is defined as the overlap length L1. The end face of the adhesion layer 20a is perpendicular to the upper surface of the substrate 10. The length of the resonance region 50 is represented by L2, and the length of the extraction region 58 is represented by L3. The edge of the extraction region 58 and the lower surface of the substrate 10 are in contact with an identical attenuation material 64. When the piezoelectric thin film resonator is fabricated, a space may be formed between the wiring layer 20 and the protective film 24. However, the space is very small, thus having little influence on simulation results.

The material and the dimensions of each layer are as follows.

Low-resistivity layer 20b of the wiring layer 20: Au with a film thickness of T1

Adhesion layer 20a of the wiring layer 20: Ti with a film thickness of 100 nm

Protective film 24: SiO$_2$ with a film thickness of 70 nm

Upper layer 16b of the upper electrode 16: Cr with a film thickness of 40 nm

Lower layer 16a of the upper electrode 16: Ru with a film thickness of 300 nm

Piezoelectric film 14: AlN with a film thickness of 1100 nm

Upper layer 12b of the lower electrode 12: Ru with a film thickness of 200 nm

Lower layer 12a of the lower electrode 12: Cr with a film thickness of 100 nm

Length L2 of the resonance region 50: 110 μm

Length L3 of the extraction region 58: 30 μm

Angle θ1 of the end face of the lower electrode 12: 35°

Angle θ2 of the end face of the low-resistivity layer 20b: 37°

The figure of merit (FOM) was simulated under the assumption that the thickness T1 of the low-resistivity layer 20b is 0.6 μm and 3 μm and the length L1 along which the wiring layer 20 and the resonance region 50 overlap is 0.5 μm and 2.5 μm. The simulated frequency range is from 1930 MHz to 1995 MHz. The FOM is calculated by the following equation.

$$FOM = \text{Electromechanical coupling coefficient}$$

$$k^2 \times \sqrt{\frac{Q \text{ value at the resonant frequency} -}{Q \text{ value at the antiresonant frequency}}}$$

As the FOM increases, the loss of the filter using the piezoelectric thin film resonator decreases.

Figure 4:
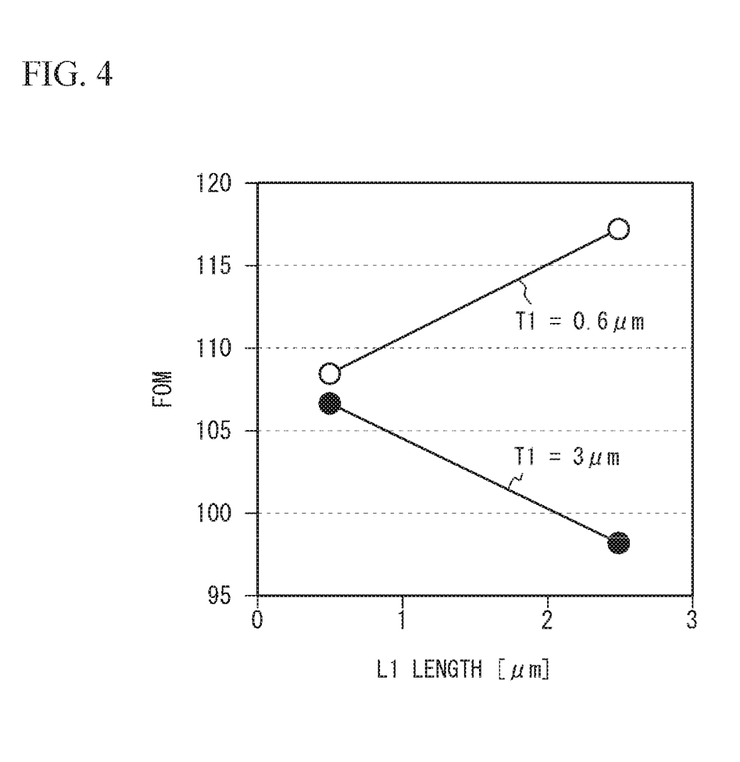
FIG. 4 is a graph of FOM versus distance L1.

FIG. 4 is a graph of FOM versus distance L1. Dots indicate simulated values, and the straight line connects the dots. As illustrated in FIG. 4, the FOM increases as L1 increases in the case of T1=0.6 μm, while the FOM decreases as L1 increases in the case of T1=3 μm.

Depending on T1, the behavior of the FOM with respect to L1 changes. To study the reason of this behavior, the amplitude of the acoustic wave in each layer was simulated.

FIG. 5A through FIG. 6B are cross-sectional views illustrating the region in which the amplitude of the acoustic wave is large, and respectively illustrate the case of T1=0.6 μm and L1=0.5 μm, the case of T1=0.6 μm and L1=2.5 μm, the case of T1=1.0 μm and L1=0.5 μm, and the case of T1=1.0 μm and L1=2.5 μm. In FIG. 5A through FIG. 6B, a cross-hatched region 62 is the region where the amplitude of the acoustic wave is $7.6923 \times 10^{-6}$ μm or greater.

Figure 5A:
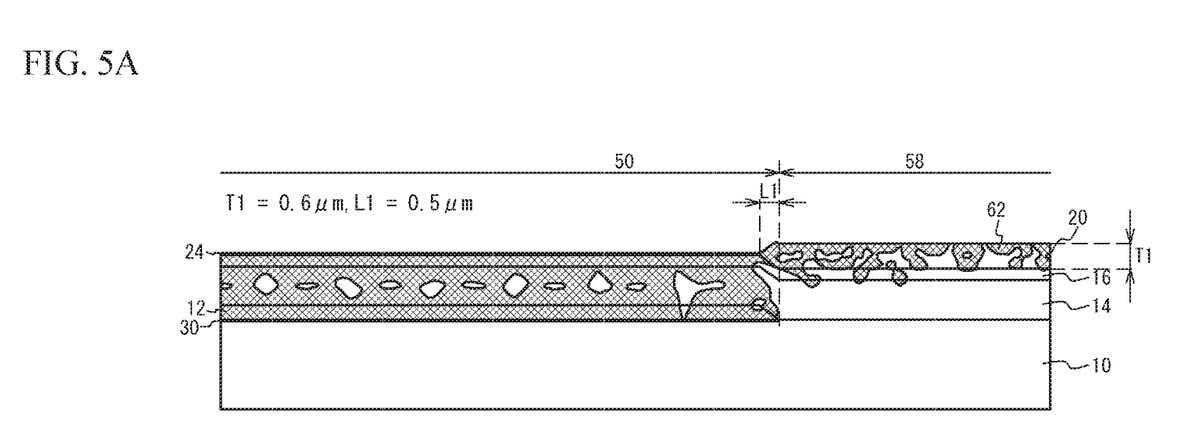
FIG. 5A and FIG. 5B are cross-sectional views illustrating the region in which the amplitude of an acoustic wave is large (No. 1)
Figure 5B:
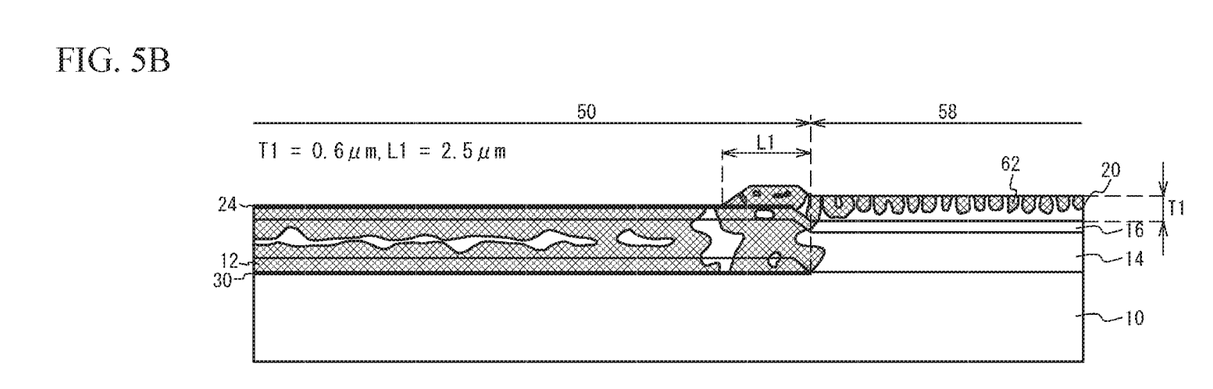

As illustrated in FIG. 5A and FIG. 5B, when T1=0.6 μm, the area of the region 62 near the wiring layer 20 in the extraction region 58 in the case of L1=2.5 μm is smaller than that in the case of L1=0.5 μm. This result indicates that the leak of the acoustic wave from the resonance region 50 to the extraction region 58 is reduced by setting L1=2.5 μm. Accordingly, the loss due to the leak of the acoustic wave is reduced by setting L1 long.

Figure 6A:
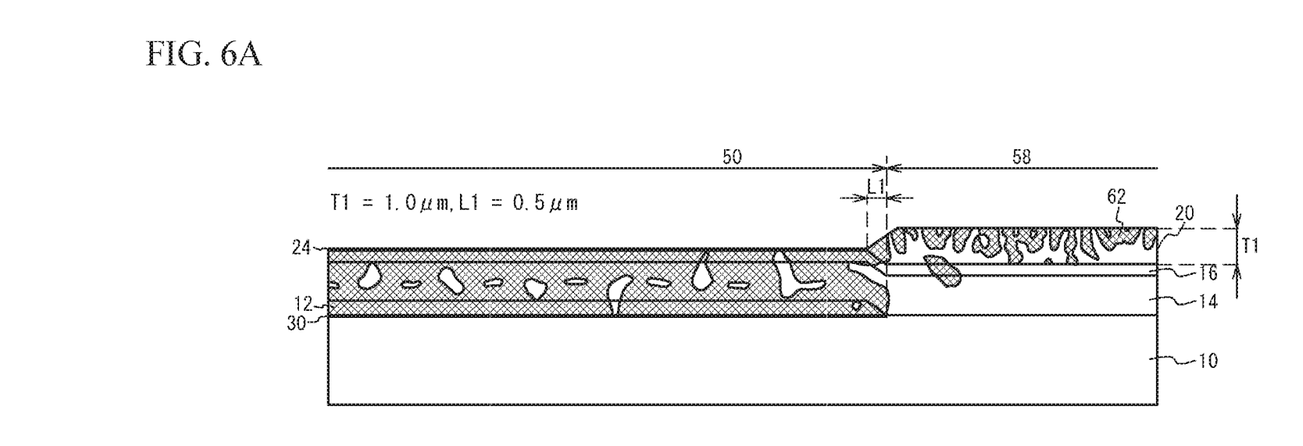
FIG. 6A and FIG. 6B are cross-sectional views illustrating the region in which the amplitude of the acoustic wave is large (No. 2)
Figure 6B:
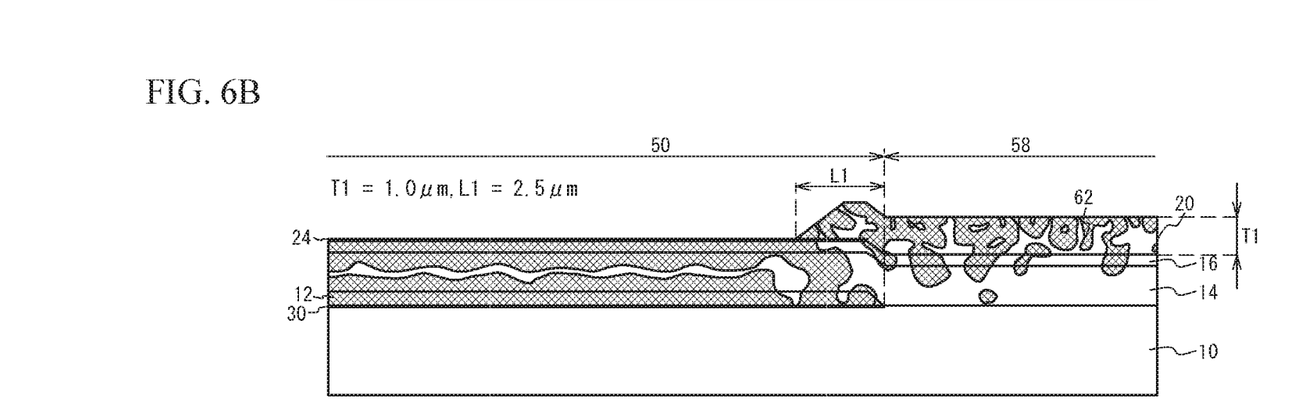

On the other hand, as illustrated in FIG. 6A and FIG. 6B, when T1=1.0 μm, the area of the region 62 near the wiring layer 20 in the extraction region 58 in the case of L1=2.5 μm is greater than that in the case of L1=0.5 μm. This result indicates that the acoustic wave propagating through the wiring layer 20 from the resonance region 50 to the extraction region 58 leaks by setting L1=2.5 μm. Thus, the loss due to the leak of the acoustic wave is increased by setting L1 long.

As described above, when T1 is small, the increase of L1 reduces the leak of the acoustic wave from the resonance region 50 to the extraction region 58, therefore improving the FOM. On the other hand, when T1 is large, the increase of L1 causes the acoustic wave to leak from the resonance region 50 to the extraction region 58 through the wiring layer 20, therefore decreasing the FOM.

Piezoelectric thin film resonators with different T1 and different L1 were fabricated to measure the FOM. The conditions of the individual layers were the same as the materials and the dimensions used for the simulation. The resonance region 50 was configured to have an elliptical shape with a minor axis length of 120 μm and a major axis length of 200 μm. The air gap 30 was configured to have a dome shape formed on the flat upper surface of the substrate 10.

Figure 7:
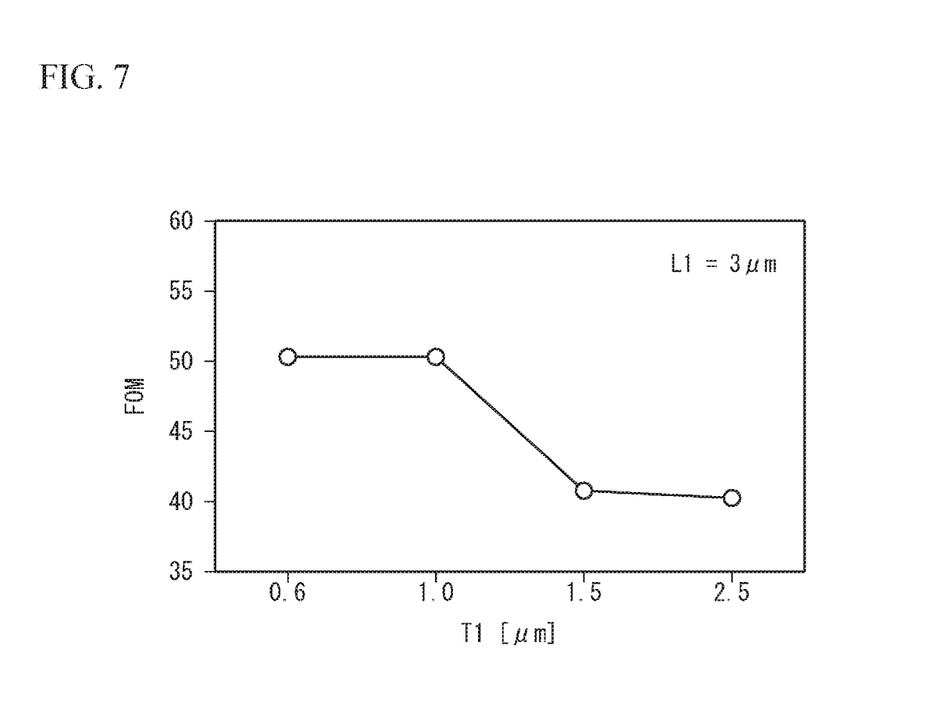
FIG. 7 is a graph of FOM versus T1.

FIG. 7 is a graph of FOM versus T1. L1 is equal to 3 μm. Dots indicate measured values, and the straight line connects the dots. As illustrated in FIG. 7, the FOMs in the cases of T1=0.6 μm and 1.0 μm are approximately the same, while the FOMs are small in the cases of T1=1.5 μm and 2.5 μm.

Figure 8:
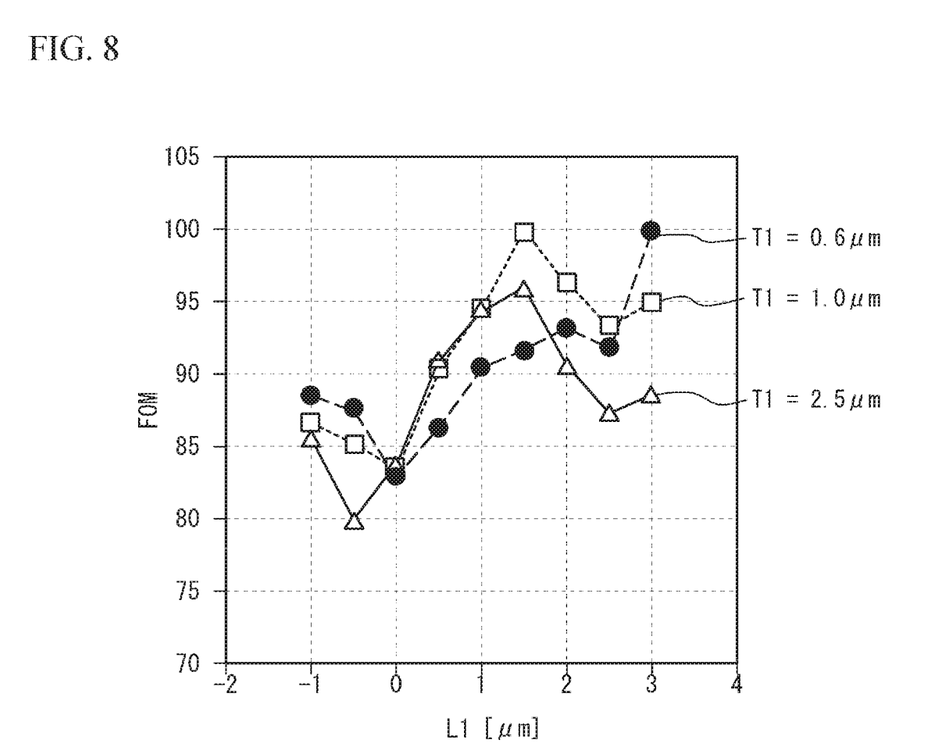
FIG. 8 is a graph of FOM versus L1.

FIG. 8 is a graph of FOM versus L1. T1 was set at 0.6 μm, 1.0 μm and 2.5 μm, and L1 was changed from −1 μm to 3 μm by 0.5-μm increments. Dots indicate measured values, and the straight line connects the dots. As illustrated in FIG. 8, when T1=0.6 μm, as L1 increases, the FOM increases. When T1=1.0 μm or 2.5 μm, the FOM increases as L1 increases in the case of L1<1.5 μm, while the FOM decreases as L1 increases in the case of L1>1.5 μm. Therefore, it is considered that the leak of the acoustic wave through the wiring layer 20 is small when T1=0.6 μm and the leak of the acoustic wave through the wiring layer 20 becomes large when T1=1.0 μm. These results agree with the simulation results illustrated in FIG. 5A through FIG. 6B.

As the film thickness T1 of the low-resistivity layer 20b increases, the resistance of the wiring layer 20 decreases. Thus, the loss due to the wiring line decreases. The loss of a high-frequency signal with a frequency of 1950 MHz due to a wiring line with a length of 1 μm was measured by using, for example, the wiring layer 20 with a width of 5 μm. The result is as follows.

$T1=0.6$ μm: −0.00132 dB/μm $T1=1.0$ μm: −0.00112 dB/μm $T1=2.5$ μm: −0.00088 dB/μm

As T1 increases, the loss decreases.

As illustrated in FIG. 2, the peeling of the multilayered film 18 and/or poor electrical connection of the upper electrode 16 caused by the crack 60 is reduced by setting L1>0. However, when the thickness T1 of the wiring layer 20 is increased to reduce the loss, the FOM decreases as illustrated in FIG. 7. Thus, the overlap length L1 is reduced. This increases the FOM. To reduce the loss due to the wiring line, T1 is preferably 0.8 μm or greater, more preferably 1.0 μm or greater, further preferably 1.5 μm or greater. To reduce the deterioration of the FOM, T1 is preferably 3.0 μm or less, more preferably 2.5 μm or less. To inhibit the peeling of the multilayered film 18 and/or the poor electrical connection of the upper electrode 16 caused by the crack 60, L1 is preferably greater than 0 μm, more preferably 0.5 μm or greater, further preferably 1 μm or greater. To reduce the deterioration of the FOM, L1 is preferably less than 2.0 μm, more preferably 1.5 μm or less.

As described above, in the first embodiment, as illustrated in FIG. 1A and FIG. 1B, the overlap length L1 is a distance between the outline of the resonance region 50 and the edge of the lower surface of the wiring layer 20 located within the resonance region 50 and farthest from the outline. The overlap length L1 is greater than 0 μm and less than 2 μm. The thickness T1 of the wiring layer 20 is 0.8 μm or greater and 3.0 μm or less. This configuration reduces the loss due to the wiring layer 20 and increases the FOM. As described above, the shape of the wiring layer 20 can be optimized.

The wiring layer 20 includes the adhesion layer 20a located on the upper electrode 16, and the low-resistivity layer 20b located on the adhesion layer 20a and made of a material with a lower resistivity than the adhesion layer 20a. In this structure, the thickness T1 of the low-resistivity layer 20b is 0.8 μm or greater and 3.0 μm or less. This configuration reduces the loss due to the wiring layer 20 and increases the FOM. In the simulated sample and the measured sample, the thickness of the low-resistivity layer 20b was made to be T1. However, in the wiring layer 20, the adhesion layer 20a is sufficiently thin with respect to the low-resistivity layer 20b. Thus, the thickness of the wiring layer 20 is substantially equal to the thickness of the low-resistivity layer 20b.

An exemplary case where the low-resistivity layer 20b is a gold layer has been described, but the low-resistivity layer 20b may be made of a material with a low resistivity such as Cu or Al instead of Au. When these materials are used, it is considered that the acoustic wave leaks through the wiring layer 20 in the same manner as when Au is used. In addition, it is considered that the materials of the lower electrode 12, the piezoelectric film 14, and the upper electrode 16 hardly affect on the leak of the acoustic wave through the wiring layer 20.

When the low-resistivity layer 20b is a gold layer, as illustrated in FIG. 8, T1 is preferably 1.0 µm or greater and 2.5 µm or less, and L1 is preferably 0.5 µm or greater and 2.0 µm or less. This configuration reduces the loss due to the wiring layer 20 and increases the FOM.

As illustrated in FIG. 1A and FIG. 1B, the wiring layer 20 is located from the extraction region 58, to which the upper electrode 16 is extracted from the resonance region 50, to the resonance region 50. This structure reduces the leak of the acoustic wave from the resonance region 50 to the extraction region 58.

As illustrated in FIG. 1A, the wiring layer 20 preferably has a region overlapping with the resonance region in plan view so that the distance between the outline of the resonance region 50 and the edge of the lower surface of the wiring layer 20 (the overlap length L1) is substantially constant. This configuration reduces the leak of the acoustic wave from the resonance region 50 more. The region where the overlap length L1 is substantially constant is preferably located at the extraction region 58 side. The leak of the acoustic wave from the resonance region 50 to the extraction region 58 is reduced.

The wiring layer 20 may be located on the lower electrode 12 in addition to on the upper electrode 16.

First Variation of First Embodiment

Figure 9A:
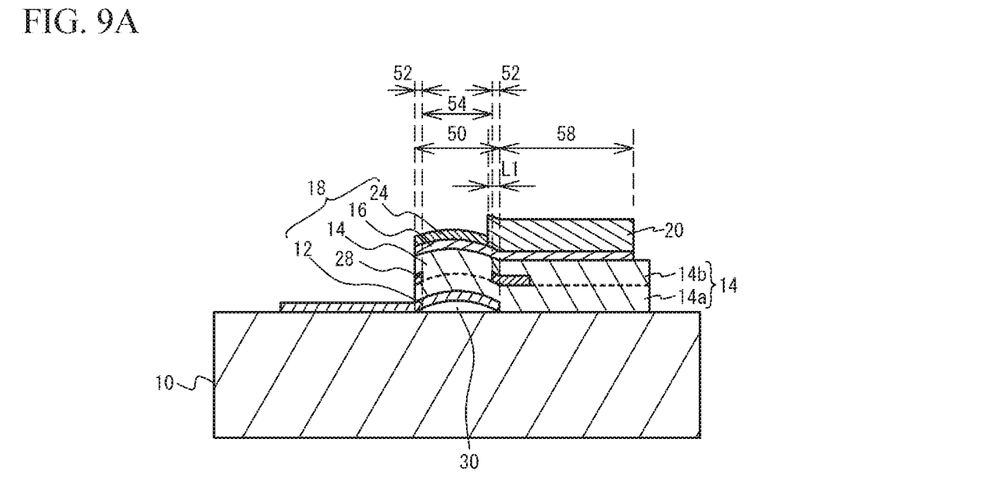
FIG. 9A through FIG. 9C are cross-sectional views of piezoelectric thin film resonators in accordance with first through third variations of the first embodiment, respectively.

FIG. 9A is a cross-sectional view of a piezoelectric thin film resonator in accordance with a first variation of the first embodiment. As illustrated in FIG. 9A, the piezoelectric film 14 includes a lower piezoelectric film 14a and an upper piezoelectric film 14b located on the lower piezoelectric film 14a. An insertion film 28 is interposed between the lower piezoelectric film 14a and the upper piezoelectric film 14b. Other structures are the same as those of the first embodiment, and the description thereof is thus omitted.

The insertion film 28 is located in an outer peripheral region 52 within the resonance region 50, and is not located in a center region 54. The outer peripheral region 52 is located within the resonance region 50, includes the outer periphery of the resonance region 50, and is located along the outer periphery. The center region 54 is located within the resonance region 50, and includes the center of the resonance region 50. The center may not be necessarily a geometric center.

The insertion film 28 is made of a material with Young's modulus or acoustic impedance less than that of the piezoelectric film 14. This configuration reduces the acoustic wave leaking in the lateral direction from the resonance region 50. The insertion film 28 is, for example, a silicon oxide film or an aluminum film.

The insertion film 28 may be located between the lower electrode 12 and the piezoelectric film 14. The insertion film 28 may be located between the piezoelectric film 14 and the upper electrode 16.

A temperature compensation film may be interposed between the lower piezoelectric film 14a and the upper piezoelectric film 14b, between the lower electrode 12 and the piezoelectric film 14, or between the piezoelectric film 14 and the upper electrode 16. The temperature compensation film has a temperature coefficient of an elastic constant opposite in sign to the temperature coefficient of the elastic constant of the piezoelectric film 14. Thus, the frequency temperature dependence of the piezoelectric thin film resonator is reduced. The temperature compensation film is, for example, a silicon oxide film.

Second Variation of First Embodiment

Figure 9B:
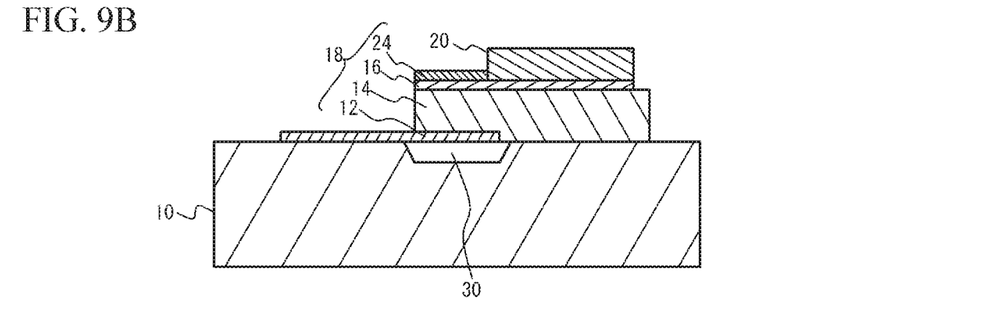

A second variation of the first embodiment changes the structure of the air gap. FIG. 9B is a cross-sectional view of a piezoelectric thin film resonator in accordance with the second variation of the first embodiment. As illustrated in FIG. 9B, a recess is formed on the upper surface of the substrate 10. The lower electrode 12 is flatly formed on the substrate 10. This structure forms the air gap 30 in the recess of the substrate 10. The air gap 30 is formed so as to include the resonance region 50. Other structures are the same as those of the first embodiment, and the description thereof is thus omitted. An insulating film may be formed on the lower surface of the lower electrode 12. That is, the air gap 30 may be formed between the substrate 10 and the insulating film being in contact with the lower electrode 12. The insulating film is, for example, an aluminum nitride film.

Third Variation of First Embodiment

Figure 9C:
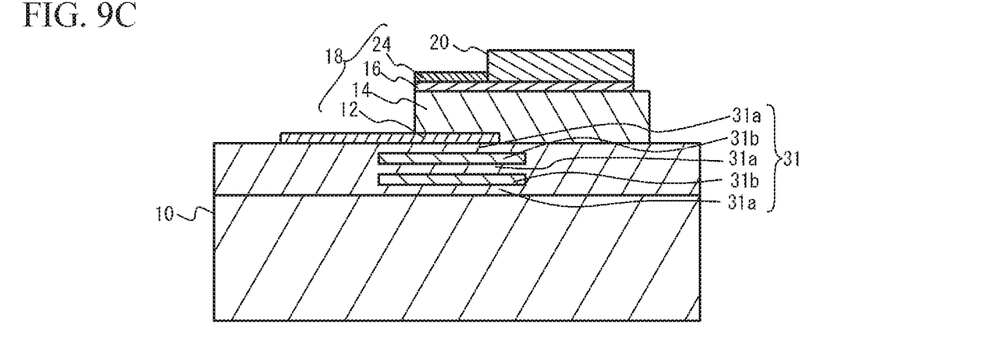

A third variation of the first embodiment uses an acoustic mirror instead of the air gap. FIG. 9C is a cross-sectional view of a piezoelectric thin film resonator in accordance with the third variation of the first embodiment. As illustrated in FIG. 9C, an acoustic mirror 31 is formed under the lower electrode 12 of the resonance region 50. The acoustic mirror 31 is formed of a film 31a with low acoustic impedance and a film 31b with high acoustic impedance alternately stacked. Each of the film 31a and 31b has a film thickness of, for example, approximately $\lambda/4$ ($\lambda$ is the wavelength of the acoustic wave). The number of the films 31a and the films 31b stacked is freely selected. For example, the acoustic mirror 31 may have a structure in which a single film with acoustic impedance different from the acoustic impedance of the substrate 10 is located in the substrate 10. Other structures are the same as those of the first embodiment, and the description thereof is thus omitted.

In the first embodiment and the first variation thereof, the air gap 30 may be formed in the same manner as the second variation of the first embodiment, or the acoustic mirror 31 may be formed instead of the air gap 30 as in the third variation of the first embodiment.

As in the first embodiment and the first and second variations thereof, the piezoelectric thin film resonator may be a film bulk acoustic resonator (FBAR) in which the air gap 30 is formed between the substrate 10 and the lower electrode 12 in the resonance region 50. Alternatively, as in the third variation of the first embodiment, the piezoelectric thin film resonator may be a solidly mounted resonator (SMR) including the acoustic mirror 31, which reflects the acoustic wave propagating through the piezoelectric film 14, under the lower electrode 12 in the resonance region 50. As described above, an acoustic reflection layer located in or on the substrate 10 may include the air gap 30 or the acoustic mirror 31 in which at least two layers with different acoustic characteristics are stacked.

In the first embodiment and the variations thereof, the resonance region 50 has an elliptical shape, but the resonance region 50 may have a polygonal shape such as a quadrangle shape or a pentagonal shape.

Second Embodiment

Figure 10A:
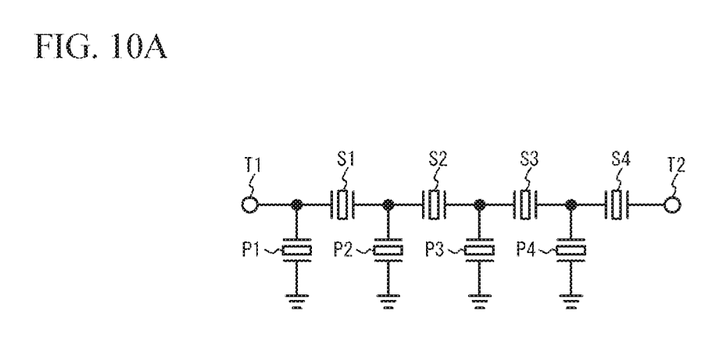
FIG. 10A is a circuit diagram of a filter in accordance with a second embodiment.

A second embodiment is an exemplary filter and an exemplary duplexer each using the piezoelectric thin film resonator according to any one of the first embodiment and the variations thereof. FIG. 10A is a circuit diagram of a filter in accordance with the second embodiment. As illustrated in FIG. 10A, one or more series resonators S1 through S4 are connected in series between an input terminal T1 and an output terminal T2. One or more parallel resonators P1 through P4 are connected in parallel between the input terminal T1 and the output terminal T2. The piezoelectric thin film resonator according to any one of the first embodiment and the variations thereof may be adopted to at least one of the one or more series resonators S1 through S4 and the one or more parallel resonators P1 through P4. The number of resonators in the ladder-type filter is appropriately set. The filter including the piezoelectric thin film resonator according to any one of the first embodiment and the variations thereof may be a multimode filter in addition to the ladder-type filter.

First Variation of Second Embodiment

Figure 10B:
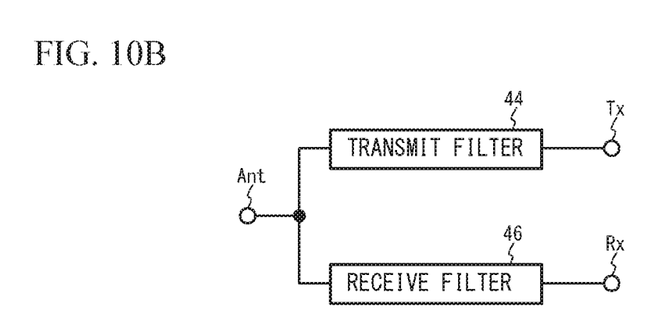
FIG. 10B is a circuit diagram of a duplexer in accordance with a first variation of the second embodiment.

FIG. 10B is a circuit diagram of a duplexer in accordance with a first variation of the second embodiment. As illustrated in FIG. 10B, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 and the receive filter 46 may be the filter of the second embodiment.

The filter includes the piezoelectric thin film resonator according to any one of the first embodiment and the variations thereof. Accordingly, the loss is reduced. Alternatively, at least one of the transmit filter 44 and the receive filter 46 may be a filter including the piezoelectric thin film resonator according to any one of the first embodiment and the variations thereof. A duplexer is described as an example of a multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A piezoelectric thin film resonator comprising:
a substrate;
a piezoelectric film located on the substrate;
a lower electrode and an upper electrode facing each other across at least a part of the piezoelectric film; and
a wiring layer located on the upper electrode, the wiring layer having a thickness equal to or greater than 0.8 µm and equal to or less than 3.0 µm, at least a part of the wiring layer overlapping in plan view with a resonance region defined by a region where the lower electrode and the upper electrode face each other across the piezoelectric film, a distance between an outline of the resonance region and an edge of a lower surface of the wiring layer located within the resonance region and farthest from the outline being greater than 0 µm and equal to or less than 1.5 µm,
wherein:
the wiring layer is located from an extraction region, to which the upper electrode is extracted from the resonance region, to the resonance region,
the piezoelectric film is an aluminum nitride film, and
the wiring layer includes a gold layer having a thickness equal to or greater than 0.8 µm and equal to or less than 3.0 µm.

2. The piezoelectric thin film resonator according to claim 1, wherein
the wiring layer includes an adhesion layer located on the upper electrode, and a low-resistivity layer located on the adhesion layer and being the gold layer.

3. The piezoelectric thin film resonator according to claim 1, wherein
the low-resistivity layer has a thickness equal to or greater than 1.0 µm and equal to or less than 2.5 µm, and
the distance is equal to or greater than 0.5 µm and equal to or less than 1.5 µm.

4. The piezoelectric thin film resonator according to claim 1, wherein
the wiring layer has a region that overlaps with the resonance region so that the distance between the outline and the edge of the lower surface is substantially constant.

5. A filter comprising:
a piezoelectric thin film resonator including:
a substrate;
a piezoelectric film located on the substrate;
a lower electrode and an upper electrode facing each other across at least a part of the piezoelectric film; and
a wiring layer located on the upper electrode, the wiring layer having a thickness equal to or greater than 0.8 µm and equal to or less than 3.0 µm, at least a part of the wiring layer overlapping in plan view with a resonance region defined by a region where the lower electrode and the upper electrode face each other across the piezoelectric film, a distance between an outline of the resonance region and an edge of a lower surface located within the resonance region and farthest from the outline being greater than 0 µm and equal to or less than 1.5 µm,
wherein:
the wiring layer is located from an extraction region, to which the upper electrode is extracted from the resonance region, to the resonance region,
the piezoelectric film is an aluminum nitride film, and
the wiring layer includes a gold layer having a thickness equal to or greater than 0.8 µm and equal to or less than 3.0 µm.

6. A multiplexer comprising:
a filter including a piezoelectric thin film resonator, wherein
the piezoelectric thin film resonator includes:
a substrate;
a piezoelectric film located on the substrate;
a lower electrode and an upper electrode facing each other across at least a part of the piezoelectric film; and
a wiring layer located on the upper electrode, the wiring layer having a thickness equal to or greater than 0.8 µm and equal to or less than 3.0 µm, at least a part of the wiring layer overlapping in plan view with a resonance region defined by a region where the lower electrode and the upper electrode face each other across the piezoelectric film, a distance between an outline of the resonance region and an edge of a lower surface located within the resonance region and farthest from the outline being greater than 0 μm and equal to or less than 1.5 μm, wherein:

the wiring layer is located from an extraction region, to which the upper electrode is extracted from the resonance region, to the resonance region, the piezoelectric film is an aluminum nitride film, and the wiring layer includes a gold layer having a thickness equal to or greater than 0.8 μm and equal to or less than 3.0 μm.

\* \* \* \* \*